United States Patent
Göötz et al.

(10) Patent No.: US 9,859,473 B2
(45) Date of Patent: Jan. 2, 2018

(54) RADIATION-EMITTING OPTOELECTRONIC DEVICE

(71) Applicant: OSRAM Opto Semiconductors GmbH, Regensburg (DE)

(72) Inventors: Britta Göötz, Regensburg (DE); Hubert Halbritter, Diefurt (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/900,155

(22) PCT Filed: Jun. 23, 2014

(86) PCT No.: PCT/EP2014/063156
§ 371 (c)(1),
(2) Date: Dec. 19, 2015

(87) PCT Pub. No.: WO2014/206936
PCT Pub. Date: Dec. 31, 2014

(65) Prior Publication Data
US 2016/0149090 A1    May 26, 2016

(30) Foreign Application Priority Data

Jun. 24, 2013  (DE) .................. 10 2013 106 573

(51) Int. Cl.
*G01J 5/20*   (2006.01)
*H01L 33/50*  (2010.01)
(Continued)

(52) U.S. Cl.
CPC ........ *H01L 33/502* (2013.01); *C09K 11/7774* (2013.01); *H01L 25/167* (2013.01);
(Continued)

(58) Field of Classification Search
CPC ......... H01L 33/502; H01L 2224/48091; H01L 2224/73265; H01L 2224/32245;
(Continued)

(56) References Cited

U.S. PATENT DOCUMENTS 7,196,354 B1 * 3/2007 Erchak .................. H01L 33/507
                                              257/79
7,635,948 B2 * 12/2009 Sotoyama .......... G02B 6/02033
                                              313/112

(Continued)

FOREIGN PATENT DOCUMENTS

| WO | 2011117791 A1 | 9/2011 |
| WO | 2011132125 A1 | 10/2011 |
| WO | 2012084239 A1 | 6/2012 |

OTHER PUBLICATIONS

Jelínková, H. et al., "Resonant pumping of dysprosium doped lead thiogallate by 1.7μm Er:YLF laser radiation," Laser Physics Letters, vol. 8, No. 5, Mar. 1, 2011, pp. 349-353.

(Continued)

*Primary Examiner* — Taeho Jo
(74) *Attorney, Agent, or Firm* — Slater Matsil, LLP

(57) ABSTRACT

A radiation-emitting optoelectronic device is provided. The radiation-emitting optoelectronic device includes a semiconductor chip that, when the device is in operation, emits primary radiation of a wavelength of between 600 nm and 1000 nm. A conversion element includes a conversion material comprising ions of one or more metals selected from a group comprising La, Ce, Pr, Nd, Sm, Eu, Gd, Tb, Dy, Ho, Er, Tm, Yb, Lu, Cr, Pb and Mg. The conversion material converts the primary radiation emitted by the semiconductor chip virtually completely into secondary radiation of a wavelength of between 1000 nm and 6000 nm.

8 Claims, 2 Drawing Sheets

(51) Int. Cl.
*C09K 11/77* (2006.01)
*H01L 25/16* (2006.01)

(52) U.S. Cl.
CPC .. *H01L 33/505* (2013.01); *H01L 2224/32245* (2013.01); *H01L 2224/48091* (2013.01); *H01L 2224/48247* (2013.01); *H01L 2224/48472* (2013.01); *H01L 2224/73265* (2013.01); *H01L 2224/8592* (2013.01); *H01L 2924/16195* (2013.01); *H01L 2924/181* (2013.01); *H01L 2933/0033* (2013.01); *H01L 2933/0041* (2013.01)

(58) Field of Classification Search
CPC ..... H01L 2224/48247; H01L 2924/181; H01L 2224/48472; H01L 33/504; H01L 2224/8592; H01L 2933/0041; H01L 25/167; H01L 2924/16195; H01L 2933/0033; H01L 2933/0083; H01L 33/505; C09K 11/7774
USPC ...................................... 250/338.4
See application file for complete search history.

(56) References Cited

U.S. PATENT DOCUMENTS

| | | | | |
|---|---|---|---|---|
| 8,829,779 B2* | 9/2014 | Schmidt | ............ | C09K 11/7774 313/503 |
| 2007/0086180 A1* | 4/2007 | Sotoyama | .......... | G02B 6/02033 362/84 |
| 2008/0173886 A1* | 7/2008 | Cheon | ................. | C09K 11/02 257/98 |
| 2008/0191609 A1* | 8/2008 | Schmidt | ............ | C09K 11/7787 313/503 |
| 2008/0287583 A1 | 11/2008 | Mataki et al. | | |
| 2009/0079340 A1* | 3/2009 | Kinoshita | ........... | C07F 15/0086 313/504 |
| 2009/0101930 A1* | 4/2009 | Li | ......................... | G02B 6/005 257/98 |
| 2010/0171076 A1* | 7/2010 | Furusawa | .......... | C09K 11/7777 252/301.4 P |
| 2010/0224891 A1* | 9/2010 | Zhang | ................. | H01L 33/0079 257/94 |
| 2010/0264333 A1* | 10/2010 | Offermans | ............ | B82Y 15/00 250/459.1 |
| 2010/0320480 A1* | 12/2010 | Rapoport | ................ | H01L 33/50 257/88 |
| 2011/0127445 A1* | 6/2011 | Zhang | ................ | A61K 41/0071 250/459.1 |
| 2011/0186811 A1* | 8/2011 | Coe-Sullivan | ......... | G02B 6/005 257/13 |
| 2012/0132930 A1* | 5/2012 | Young | ................. | H01L 31/0481 257/84 |
| 2012/0175588 A1* | 7/2012 | Qiao | .................... | C09K 11/883 257/13 |
| 2012/0205674 A1* | 8/2012 | Lee | .................... | C09K 11/7734 257/88 |
| 2012/0217477 A1* | 8/2012 | So | .......................... | B82Y 30/00 257/21 |
| 2013/0000952 A1* | 1/2013 | Srinivas | ................... | H01B 1/02 174/126.1 |
| 2013/0075692 A1* | 3/2013 | Naasani | ................. | C09K 11/02 257/13 |
| 2013/0127332 A1* | 5/2013 | Chen | ................... | C09K 11/025 313/503 |
| 2013/0214249 A1* | 8/2013 | Pan | ..................... | H01L 51/5012 257/13 |
| 2013/0277957 A1 | 10/2013 | Kecht et al. | | |
| 2013/0324909 A1* | 12/2013 | Aydt | .................... | A61F 9/00834 604/20 |
| 2013/0326941 A1* | 12/2013 | Pickett | .................. | A01G 7/045 47/1.4 |
| 2014/0022779 A1* | 1/2014 | Su | ............................ | F21K 9/64 362/231 |
| 2014/0111652 A1* | 4/2014 | So | ............................ | G01J 1/58 348/164 |
| 2014/0284649 A1* | 9/2014 | Baumgartner | ..... | C09K 11/7734 257/98 |
| 2015/0295144 A1* | 10/2015 | Weiler | .................. | H01L 33/504 362/84 |

OTHER PUBLICATIONS

Liu, W.B. et al., "Fabrication and Characterization of Transparent Tm,Ho:YAG Ceramic," Novel Laser Materials, Laser Physics, vol. 22, No. 10, Sep. 3, 2012, pp. 1622-1626.

Sorokina, I.T. et al., "Solid-State Mid-Infrared Laser Sources," Topics in Applied Physics, vol. 89, Jul. 10, 2003, pp. 226-510.

* cited by examiner

RADIATION-EMITTING OPTOELECTRONIC DEVICE

This patent application is a national phase filing under section 371 of PCT/EP2014/063156, filed Jun. 23, 2014, which claims the priority of German patent application 10 2013 106 573.2, filed Jun. 24, 2013, each of which is incorporated herein by reference in its entirety.

TECHNICAL FIELD

The invention relates to a radiation-emitting optoelectronic device comprising a conversion element.

BACKGROUND

In conventional radiation-emitting optoelectronic devices, which emit radiation in the infrared range of the electromagnetic spectrum, converter plates of indium antimonide are often used.

SUMMARY

At least one embodiment of the present invention provides a radiation-emitting optoelectronic device which comprises a conversion element comprising a conversion material and which on the one hand is efficient and on the other hand is inexpensive to produce.

A radiation-emitting optoelectronic device is provided. This comprises a semiconductor chip which, when the device is in operation, emits primary radiation of a wavelength of between 600 nm and 1000 nm and a conversion element comprising a conversion material which converts the primary radiation emitted by the semiconductor chip when the device is in operation virtually completely into secondary radiation of a wavelength of between 1000 nm and 6000 nm. The conversion material comprises ions of one or more metals selected from a group comprising La, Ce, Pr, Nd, Sm, Eu, Gd, Tb, Dy, Ho, Er, Tm, Yb, Lu, Cr, Pb, and Mg.

Virtually complete conversion of the primary radiation into a secondary radiation should be understood to mean conversion of over 95%, in particular over 98%.

The semiconductor chip comprises an active epitaxial layer sequence, which is suitable for generating primary radiation of a wavelength of between 600 nm and 1000 nm when the radiation-emitting optoelectronic device is in operation.

To generate the primary radiation, the epitaxial layer sequence may, for example, comprise a pn-junction, a double heterostructure, a single quantum well structure or particularly preferably a multi quantum well structure. The term quantum well structure does not contain any indication of dimensionality. It thus encompasses inter alia quantum troughs, quantum wires and quantum dots and any combination of these structures.

A semiconductor chip which is suitable for emitting red to infrared primary radiation of a wavelength of between 600 nm and 1000 nm when in operation is based, for example, on arsenide compound semiconductor materials.

In the present context, "based on arsenide compound semiconductor materials" means that the epitaxial layer sequence or at least one layer thereof comprises a group III-arsenide compound semiconductor material, preferably $Al_nGa_mIn_{1-n-m}As$ with $0 \leq n \leq 1$, $0 \leq m \leq 1$ and $n+m \leq 1$. This material does not absolutely have to exhibit a mathematically exact composition according to the above formula. Instead, it may comprise one or more dopants and additional constituents which do not substantially modify the characteristic physical properties of the $Al_nGa_mIn_{1-n-m}As$ material. For simplicity's sake, however, the above formula includes only the fundamental constituents of the crystal lattice (Al, Ga, In, As), even if these may in part be replaced by small quantities of further substances.

The semiconductor chip preferably emits primary radiation of a wavelength of between 800 nm and 1000 nm when the device is in operation. This ensures that the small proportion of primary radiation which is not converted into secondary radiation, and thus might be released outwards to the environment surrounding the device, is not in the visible, i.e., in the red range of the electromagnetic spectrum. In a preferred embodiment, only radiation in the infrared range of the electromagnetic spectrum, in the wavelength range from 800 nm to 6000 nm, is emitted by the device to the surrounding environment.

In one embodiment, the conversion material comprises one or more emission bands in the visible range of the electromagnetic spectrum, in addition to one or more emission bands in the wavelength range between 1000 nm and 6000 nm. To prevent the emission of secondary radiation in the visible range, the semiconductor chip emits primary radiation of a wavelength preferably of between 800 nm and 1000 nm when the device is in operation, such that the emission of secondary radiation in the visible range, i.e., below 800 nm, cannot be excited, since the energy level of the primary radiation is too low therefor.

The conversion material preferably converts the primary radiation emitted by the semiconductor chip when the device is in operation virtually completely into secondary radiation of a wavelength of between 1500 nm and 5000 nm, particularly preferably between 2000 nm and 5000 nm.

In one embodiment, the radiation-emitting optoelectronic device comprises at least one further semiconductor chip, which emits primary radiation of a wavelength of between 600 nm and 1000 nm when the device is in operation. All the features which have been mentioned in respect of the semiconductor chip also apply to the further semiconductor chips.

For example, the radiation-emitting optoelectronic device may be a light-emitting diode, or LED for short. In other words, the device then emits incoherent radiation when in operation. It is moreover possible for the device to be a laser diode. In other words, the device then emits monochromatic and/or coherent radiation when in operation.

In one embodiment of the device, the conversion material comprises quantum dots which comprise Pb ions. A quantum dot is a nano structure which is composed of around $10^2$ to $10^5$ atoms. The size of the quantum dots, i.e., the number of atoms of which a quantum dot is composted, allows the wavelength of the secondary radiation to be varied.

In one embodiment, the quantum dots comprise PbS.

According to one embodiment, the conversion material comprises a host material and ions of one or more metals, which are selected from a group comprising La, Ce, Pr, Nd, Sm, Eu, Gd, Tb, Dy, Ho, Er, Tm, Yb, Lu, Cr, Mg and Pb. The ions are preferably those of one or more metals which are selected from a group comprising Pr, Nd, Sm, Eu, Ho, Er, Tm, Yb, Lu, Cr and Pb. The metal ions are particularly preferably Ho and Tm.

In one embodiment, the metal ions are the divalent or trivalent cations of the metals which are selected from a group comprising La, Ce, Pr, Nd, Pm, Sm, Eu, Gd, Tb, Dy, Ho, Er, Tm, Yb, Lu, Cr, Mg and Pb. They are preferably the trivalent cations. In the case of Mg and Pb, they are preferably the divalent cations.

A conversion material comprising $Pr^{3+}$ ions may convert the primary radiation into secondary radiation of a wavelength of for instance 1.25-1.45 μm, 2.0 μm, 2.2-2.7 μm and/or 4.5-5.5 μm. A conversion material comprising $Nd^{3+}$ ions may convert the primary radiation into secondary radiation of a wavelength of for instance 1.05 μm, 1.34 μm and/or 1.57 μm. A conversion material comprising $Sm^{3+}$ ions may convert the primary radiation into secondary radiation of a wavelength of for instance 1.5 μm. A conversion material comprising $Dy^{3+}$ ions may convert the primary radiation into secondary radiation of a wavelength of for instance 2.36 μm and/or 4.3 μm. A conversion material comprising $Ho^{3+}$ ions may convert the primary radiation into secondary radiation of a wavelength of for instance 2.0-2.1 μm. A conversion material comprising $Er^{3+}$ ions may convert the primary radiation into secondary radiation of a wavelength of for instance 1.5 μm, 1.7 μm, 2.7 μm, 2.94 μm and/or 4.5 μm. A conversion material comprising $Tm^{3+}$ ions may convert the primary radiation into secondary radiation of a wavelength of for instance 2.02 μm and/or 1.8-4.7 μm. A conversion material comprising $Yb^{3+}$ ions may convert the primary radiation into secondary radiation of a wavelength of for instance 1.03 μm and/or 1.2-1.5 μm. A conversion material comprising $Cr^{3+}$ ions may convert the primary radiation into secondary radiation of a wavelength of for instance 1.1-1.6 μm. A conversion material comprising $Pb^{2+}$ ions may convert the primary radiation into secondary radiation of a wavelength of for instance 2.9-6.0 μm.

In one embodiment, the host material is selected from a group comprising glass, ceramic material, nitride-containing compounds and fluorine-containing compounds. The fluorine-containing compounds are selected from a group comprising $MgF_2$, $BaF_2$, $LiF$, $CaF_2$, $SrF_2$, $LaF_3$, $AlF_3$, $YF_3$, $ZrF_4$ and combinations thereof.

In one embodiment, the conversion element consists of the conversion material. For example, the conversion element consists of a ceramic material or a glass with embedded $La^{3+}$, $Ce^{3+}$, $Pr^{3+}$, $Nd^{3+}$, $Pm^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Cr^{3+}$, $Mg^{2+}$ and/or $Pb^{2+}$ salts. For example, the salts comprise fluorides, bromides, oxides or nitrides. The glass may be silica glass. The ceramic material may be an oxide ceramic, such as for example, $B_2O_3$, $Al_2O_3$, $Y_4Al_2O_9$ or $Y_3Al_5O_{12}$, a nitride, for example, $Si_3N_4$-based ceramic or an oxynitride ceramic of the formula $Si_xO_yN_z$, wherein x, y and z are natural numbers and wherein $4x=2y+3z$.

In one embodiment, the host material forms with the ions a compound of formula $(A,B)_3X_5O_{12}$, of formula $(A,B)_2X^*{}_3O_{12}$, of formula $C_3(A,B)_2Z_3O_{12}$, of formula $C_3(A,B)_2Z^*{}_6O_{24}$ or of formula $(A,B)_3X_5N_8$, wherein
A=$Fe^{3+}$, $Cr^{3+}$, $V^{3+}$, $Ti^{3+}$, $Sc^{3+}$, $Lu^{3+}$ or $Y^{3+}$;
B is a trivalent cation of one of the metals La, Ce, Pr, Nd, Pm, Sm, Eu, Gd, Tb, Dy, Ho, Er, Tm, Yb, Lu or Cr;
C=$Mg^{2+}$, $Fe^{2+}$, $Mn^{2+}$, $Pb^{2+}$ or $Ca^{2+}$;
X=$Al^{3+}$ or $B^{3+}$;
X*=$W^{6+}$;
Z=$Si^{4+}$ or $Ti^{4+}$ and
Z*=$W^{6+}$.
Preferably, B=$Ho^{3+}$ or $Tm^{3+}$.

In one embodiment, the ratio A:B is between 1:0.1 and 1:0.001, preferably between 1:0.04 and 1:0.001.

In one embodiment, the proportion of B is between 0.1 to 10 mol percent relative to the total proportion of A and B, i.e., if the total quantity of A and B corresponds to 100 mol percent. Preferably, the proportion of B is approx. 4 mol percent relative to the total proportion of A and B.

Preferably the host material forms with the ions a compound of formula $(Lu,Ho)_3Al_5O_{12}$, $(Y,Ho)_3Al_5O_{12}$, $Mg_3(Lu,Ho)_2Si_3O_{12}$, $Mg_3(Y,Ho)_2Si_3O_{12}$, $(Lu,Tm)_3Al_5O_{12}$, $(Y,Tm)_3Al_5O_{12}$, $Mg_3(Lu,Tm)_2Si_3O_{12}$, $Mg_3(Y,Tm)_2Si_3O_{12}$, $(Lu,Ho)_2W_3O_{12}$, $(Y,Ho)_2W_3O_{12}$, $(Lu,Tm)_2W_3O_{12}$, $(Y,Tm)_2W_3O_{12}$, $(Lu,Ho)_3Al_5N_8$, $(Y,Ho)_3Al_5N_8$, $(Lu,Tm)_3Al_5N_8$, $(Y,Tm)_3Al_5N_8$, $Mg_3(Lu,Ho)_2W_6O_{24}$, $Mg_3(Y,Ho)_2W_6O_{24}$, $Mg_3(Y,Tm)_2W_6O_{24}$ or $Mg_3(Lu,Tm)_2W_6O_{24}$. In other words, the conversion material is preferably $(Lu,Ho)_3Al_5O_{12}$, $(Y,Ho)_3Al_5O_{12}$, $Mg_3(Lu,Ho)_2Si_3O_{12}$, $Mg_3(Y,Ho)_2Si_3O_{12}$, $(Lu,Tm)_3Al_5O_{12}$, $(Y,Tm)_3Al_5O_{12}$, $Mg_3(Lu,Tm)_2Si_3O_{12}$, $Mg_3(Y,Tm)_2Si_3O_{12}$, $(Lu,Ho)_2W_3O_{12}$, $(Y,Ho)_2W_3O_{12}$, $(Lu,Tm)_2W_3O_{12}$, $(Y,Tm)_2W_3O_{12}$, $(Lu,Ho)_3Al_5N_8$, $(Y,Ho)_3Al_5N_8$, $(Lu,Tm)_3Al_5N_8$, $(Y,Tm)_3Al_5N_8$, $Mg_3(Lu,Ho)_2W_6O_{24}$, $Mg_3(Y,Ho)_2W_6O_{24}$, $Mg_3(Y,Tm)_2W_6O_{24}$ or $Mg_3(Lu,Tm)_2W_6O_{24}$.

According to one embodiment, the conversion material is a powder. The powder may comprise converter particles. The converter particles have a particle diameter of 1 to 50 μm. Preferably the converter particles have a particle diameter of 5 to 15 μm, particularly preferably of 10 μm.

In one embodiment, a ceramic material of which the conversion element consists is produced from the powder.

In one embodiment, the host material comprises organic complex ligands. In this embodiment, the host material forms with the ions an organometallic complex which has the metal ions as the central atom. The complexes may be mono- or indeed polynuclear.

In one embodiment, the conversion element comprises a sensitizer. The sensitizer is excited by the emitted primary radiation when the apparatus is in operation. The conversion material then emits the energy transmitted from the sensitizer to the conversion material in the form of a secondary radiation of a wavelength of between 1000 nm and 6000 nm. A sensitizer may be used if the conversion material comprises one or more emission bands in the visible range of the electromagnetic spectrum in addition to one or more emission bands in the wavelength range between 1000 nm and 6000 nm. A sensitizer is used, in particular, if the conversion material exhibits no or only slight primary radiation absorption. First of all, the sensitizer is excited by the primary radiation. In this case, an exciton is excited from the basic state to a higher energy level. Then the exciton is transferred to the conversion material. This transfer proceeds in radiationless manner. The conversion material emits a secondary radiation of a wavelength of between 1000 nm and 6000 nm. In other words, the conversion material is not excited directly by the primary radiation, but rather by radiationless transfer of an exciton from the sensitizer to the conversion material.

In one embodiment, the conversion element comprises a conversion material and a matrix material or consists of a conversion material and a matrix material. The conversion material may be embedded in the matrix material. It is possible for the conversion material to be distributed homogeneously in the matrix material. It is however also possible for the conversion material to be distributed with a concentration gradient in the matrix material. The matrix material in particular comprises or consists of one of the following materials: a silicone, an epoxide, a polyurethane, an acrylate, a polycarbonate or a glass.

One possible embodiment of the conversion element is an embodiment in the form of a potting compound, wherein the potting compound encloses the semiconductor chip in form-fitting manner. Furthermore, the potting compound enclosing the semiconductor chip in form-fitting manner may be stabilized at the side walls, for example, by a package and is located, for example, in a recess in such a package.

The conversion element may moreover take the form of a conversion layer. In the case of a conversion layer, there is direct contact between conversion layer and semiconductor chip, wherein the thickness of the conversion layer may, for example, be less than the thickness of the semiconductor chip and may, for example, be constant at all radiation exit faces. Such a conversion layer is applied in particular by the following methods: spray coating, injection molding, transfer molding, jetting, dispensing or electrophoresis.

The conversion element may moreover in particular assume the form of a cover plate, a rigid plate or a film. In these further variant embodiments of the conversion element, there is not necessarily any direct and/or form-fitting contact between the conversion element and the semiconductor chip. That is to say, there may be spacing between the conversion element and the semiconductor chip. In other words, the conversion element is arranged downstream of the semiconductor chip and is irradiated by the primary radiation. A potting body or an air gap may then be formed between conversion element and semiconductor chip. An advantageous feature of this geometric arrangement is that, in particular due to the spacing between conversion element and semiconductor chip, the converter element undergoes less heating by waste heat from the semiconductor chip. However, a disadvantage may be that heating of the conversion element due to the Stokes shift cannot be dissipated to the semiconductor chip.

The stated embodiments of the radiation-emitting optoelectronic device may be used for the uses stated below.

Use of the radiation-emitting optoelectronic device according to the above-stated embodiments to melt ice is indicated. Radiation-emitting optoelectronic devices which emit radiation in a wavelength range of for instance 1500 nm to 1600 nm are particularly suitable.

Use of the radiation-emitting optoelectronic device in a gas sensor to determine gas concentrations is indicated. The gases which may be determined are gases with harmonic components in the range between 1000 nm and 5000 nm. The concentrations of gases such as $CO_2$, CO, $NH_3$, NO, $NO_2$, $SO_2$, $C_2H_6$, $C_2H_4$ may, for example, be determined. The radiation-emitting optoelectronic device may thus be used in a gas sensor for determining waste gas or for environmental monitoring.

The stated embodiments of the radiation-emitting optoelectronic device may be components of a gas sensor.

A gas sensor is provided that comprises a radiation-emitting optoelectronic device according to one of the above-described embodiments. The gas sensor further comprises a gas chamber and a detector. The gas chamber is filled with a gas, the composition of which may be determined on the basis of the concentration of the various gases. The gas chamber is arranged between the radiation-emitting optoelectronic device and the detector. The detector may detect the radiation which is emitted by the radiation-emitting optoelectronic device. It is also possible for sound waves to be detected by the detector.

In one embodiment of the gas sensor, the presence and/or the concentrations of gases such as $CO_2$, CO, $NH_3$, NO, $NO_2$, $SO_2$, $C_2H_6$ and $C_2H_4$ may be determined.

The radiation emitted by the radiation-emitting optoelectronic device meets the gas in the gas chamber and is absorbed by the gas. The change in the radiation emitted by the radiation-emitting optoelectronic device brought about by the gas in the gas chamber is detected by the detector. In this way, the composition of the gas and the concentration of the individual gases in the gas chamber may be determined.

The stated embodiments of the radiation-emitting optoelectronic device may be produced using the method stated below.

The method comprises providing a semiconductor chip which can emit primary radiation of a wavelength of between 600 nm and 1000 nm, and applying a conversion element over the semiconductor chip. The conversion element comprises a conversion material comprising ions of one or more metals selected from a group comprising La, Ce, Pr, Nd, Sm, Eu, Gd, Tb, Dy, Ho, Er, Tm, Yb, Lu, Cr, Pb and Mg. The conversion material may convert the primary radiation emitted by the semiconductor chip virtually completely into secondary radiation of a wavelength of between 1000 nm and 6000 nm.

In one embodiment, the conversion element is a potting compound. According to this embodiment, method step B) comprises the following method step: B1) enclosing the semiconductor chip in a conversion element which comprises a conversion material comprising ions of one or more metals selected from a group comprising La, Ce, Pr, Nd, Sm, Eu, Gd, Tb, Dy, Ho, Er, Tm, Yb, Lu, Cr, Pb and Mg, which conversion material may convert the primary radiation emitted by the semiconductor chip virtually completely into secondary radiation of a wavelength of between 1000 nm and 6000 nm.

In one embodiment, the conversion element is a conversion layer. According to this embodiment, method step B) comprises the following method step: B1*) applying a conversion element in the form of a conversion layer directly onto the semiconductor chip by means of spray coating, injection molding, transfer molding, jetting, dispensing or electrophoresis, wherein the conversion element comprises a conversion material comprising ions of one or more metals selected from a group comprising La, Ce, Pr, Nd, Sm, Eu, Gd, Tb, Dy, Ho, Er, Tm, Yb, Lu, Cr, Pb and Mg, which conversion material may convert the primary radiation emitted by the semiconductor chip virtually completely into secondary radiation of a wavelength of between 1000 nm and 6000 nm.

The conversion layer may also be produced by applying a matrix material and subsequently applying the conversion material in the form of a powder (scattering). In one embodiment, the conversion material sediments into the matrix material after application. Subsequent to scattering, matrix material may be applied again, in order optionally further to fix the conversion material.

In one embodiment, the conversion element is a cover plate, a rigid plate or a film. According to this embodiment, method step B) comprises the following method steps: B1) producing a conversion element in the form of a cover plate, a rigid plate or a film by means of printing, molding or stamping, wherein the conversion element comprises a conversion material comprising ions of one or more metals selected from a group comprising La, Ce, Pr, Nd, Sm, Eu, Gd, Tb, Dy, Ho, Er, Tm, Yb, Lu, Cr, Pb and Mg, which conversion material may convert the primary radiation emitted by the semiconductor chip virtually completely into secondary radiation of a wavelength of between 1000 nm and 6000 nm; B2) applying the cover plate, the rigid plate or the film over the semiconductor chip. A potting body or an air gap may be formed between conversion element and semiconductor chip.

BRIEF DESCRIPTION OF THE DRAWINGS

Further advantageous embodiments and further developments of the invention are revealed by the exemplary embodiments described below in connection with the figures.

Figure 1:
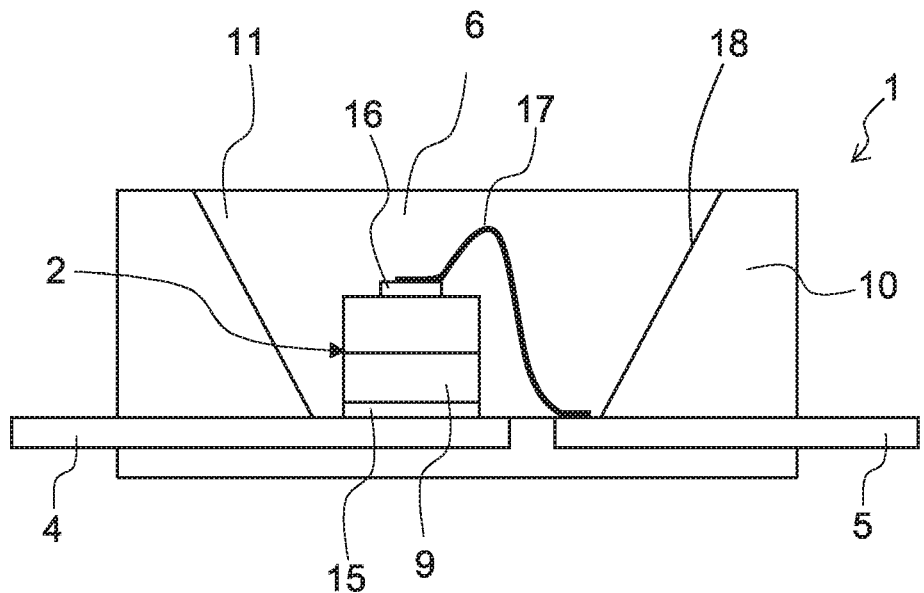
FIGS. 1 to 3 show schematic side views of various embodiments of radiation-emitting optoelectronic devices.

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

The exemplary embodiment shown in FIG. 1 of a radiation-emitting optoelectronic device 1 comprises a semiconductor chip 2, a back surface contact 15, a front surface contact 16 and an active epitaxial layer sequence 9, wherein the active epitaxial layer sequence 9 emits primary radiation of a wavelength of between 600 nm and 1000 nm when in operation.

The semiconductor chip 2 is mounted by means of an electrically conductive bonding agent with the back surface contact 15 on a first terminal 4. The electrically conductive bonding agent used is, for example, a metallic solder or an adhesive. The front surface contact 16 is bonded to a second electrical terminal 5 by means of a bonding wire 17.

In the exemplary embodiment shown in FIG. 1, the first and second electrical terminals 4, 5 are embedded in an opaque, for example, prefabricated basic package 10 with a recess 11. "Prefabricated" should be understood to mean that the basic package 10 has already been fully formed on the terminals 4, 5, for example, by means of injection molding before the semiconductor chip 2 is mounted on the terminal 4. The basic package 10 comprises, for example, an opaque plastics material and the recess 11 is configured in terms of its shape as a reflector 18 for the primary radiation and secondary radiation, wherein the reflection may optionally be achieved by a suitable coating of the inner walls of the recess 11. Such basic packages 10 are used in particular for surface-mountable light-emitting diodes. They are applied prior to mounting of the semiconductor chip 2 to a conductor tape comprising the electrical terminals 4, 5, for example, by means of injection molding and/or transfer molding.

In the exemplary embodiment of FIG. 1, the conversion element 6 takes the form of a potting compound and fills the recess 11, as shown in FIG. 1. The conversion element comprises a conversion material and a matrix material, in which the conversion material is embedded. The matrix material, for example, of an acrylate. The conversion material consists of a host material and $Tm^{3+}$ ions, wherein the host material with the $Tm^{3+}$ ions forms a compound of the formula $(Y,Tm)_3Al_5O_{12}$. The primary radiation emitted by the semiconductor chip 2 is converted at least in part by the conversion material into secondary radiation of a wavelength of between 1000 nm and 5000 nm.

Figure 2:
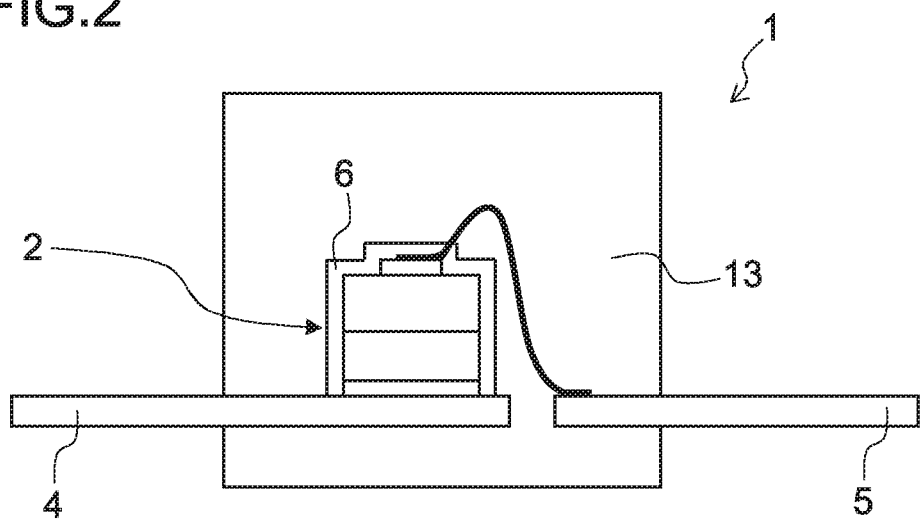

A further exemplary embodiment of a radiation-emitting optoelectronic device described here is described in connection with FIG. 2. In the exemplary embodiment of FIG. 2, the conversion element 6 is configured as a layer. The conversion element consists of a silica glass, in which converter particles of $(Lu,Ho)_3Al_5O_{12}$ are distributed homogeneously as conversion material.

The conversion element 6 is applied directly onto the semiconductor chip 2. The semiconductor chip 2 and at least sub-regions of the electrical terminals 4, 5 are enclosed by a radiation-transmissive enclosure 13, which does not bring about any change in wavelength or frequency in the radiation passing through the conversion element 6. The radiation-transmissive enclosure may, for example, consist of at least one of the following materials and/or contain at least one of the following materials: silicone, epoxide, polyurethane or glass.

Figure 3:
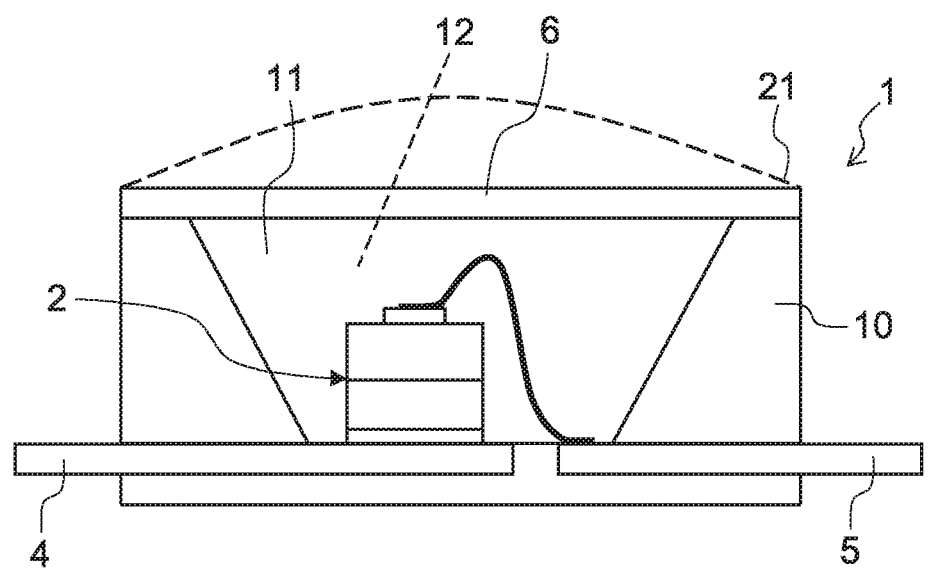

In the exemplary embodiment shown in FIG. 3, the first and second electrical terminals 4, 5 are embedded in an opaque, possibly prefabricated basic package 10 with a recess 11. As is apparent from FIG. 3, the free surfaces of the semiconductor chip 2 and sub-regions of the electrical terminals 4 and 5 are surrounded at least in part and/or directly by a radiation-transmissive enclosure 12. This radiation-transmissive enclosure 12 does not cause any change in wavelength in the primary radiation emitted by the semiconductor chip 2. The radiation-transmissive enclosure 12 consists, for example, of one of the radiation-transmissive materials already mentioned above or contains at least one of these materials. Furthermore, the recess 11 in this embodiment may be filled with a gas.

The recess 11 of FIG. 3 is covered by a conversion element 6 consisting of a matrix material and a conversion material, wherein the conversion element 6 is, for example, a separately produced cover plate 6 mounted on the basic package 10. Examples of suitable materials which may be considered for the conversion element 6 include a ceramic material in which $(Y,Ho)_3Al_5N_8$ is homogeneously distributed as a conversion material.

For better outcoupling of the light out of the conversion element 6 of FIG. 3, a lenticular cover 21 (shown in broken lines) may be provided on a side face of the device at which radiation exits, the lenticular cover reducing the total reflection of the radiation within the conversion element 6. This lenticular cover 21 may in particular consist of a radiation-transmissive plastics material or a glass and, for example, be adhesively bonded to the conversion element 6 or configured directly as a component of the conversion element 6.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. A radiation-emitting optoelectronic device comprising:
a semiconductor chip configured to emit primary radiation of a wavelength of between 800 nm and 1000 nm when the device is in operation; and
a conversion element that comprises a conversion material comprising a host material and ions of at least one metal selected from the group consisting of La, Ce, Pr, Nd, Pm, Sm, Eu, Gd, Tb, Dy, Ho, Er, Tm, Yb, Lu, and Cr,
wherein the host material with the ions form a compound of a formula, the formula being one of $(A,B)_3X_5O_{12}$, $(A,B)_2X^*_3O_{12}$, $C_3(A,B)_2Z_3O_{12}$, $C_3(A,B)_2Z^*_6O_{24}$ and $(A,B)_3X_5N_8$, wherein:
A=$Fe^{3+}$, $Cr^{3+}$, $V^{3+}$, $Ti^{3+}$, $Sc^{3+}$, $Lu^{3+}$ or $Y^{3+}$;
B is a trivalent cation of a metal selected from the group consisting of La, Ce, Pr, Nd, Pm, Sm, Eu, Gd, Tb, Dy, Ho, Er, Tm, Yb, Lu and Cr;
C=$Mg^{2+}$, $Fe^{2+}$, $Mn^{2+}$, $Pb^{2+}$ or $Ca^{2+}$;
X=$Al^{3+}$ or $B^{3+}$;
X*=$W^{6+}$;
Z=$Si^{4+}$ or $Ti^{4+}$; and
Z*=$W^{6+}$, and
wherein the conversion material is configured to convert the primary radiation emitted by the semiconductor chip with a conversion over 95% into secondary radiation of a wavelength of between woo nm and 6000 nm when the device is in operation.

2. The radiation-emitting optoelectronic device according to claim 1, wherein B=$Ho^{3+}$ or $Tm^{3+}$.

3. The radiation-emitting optoelectronic device according to claim 1, wherein the conversion element comprises a sensitizer that is excited by the emitted primary radiation when the device is in operation, wherein an exciton is excited from a basic state to a higher energy level, the exciton is transferred to the conversion material and the conversion material emits a secondary radiation of a wavelength of between 1000 nm and 6000 nm.

4. The radiation-emitting optoelectronic device according to claim 1, wherein the conversion element is part of a potting compound of the semiconductor chip.

5. The radiation-emitting optoelectronic device according to claim 1, wherein the conversion element forms a potting compound.

6. The radiation-emitting optoelectronic device according to claim 1, wherein the conversion element takes the form of a layer that is in direct contact with the semiconductor chip.

7. A gas sensor comprising:
a radiation-emitting optoelectronic device according to claim 1,
a detector configured to detect radiation; and
a gas chamber arranged between the radiation-emitting optoelectronic device and the detector,
wherein the radiation detected by the detector is at least one of the primary radiation and secondary radiation emitted by the radiation-emitting optoelectronic device and then passed through the gas chamber.

8. A method of producing a radiation-emitting optoelectronic device, the method comprising:
providing a semiconductor chip configured to emit primary radiation of a wavelength of between 800 nm and 1000 nm; and
applying a conversion element over the semiconductor chip, the conversion element comprising a conversion material comprising a host material and ions of at least one metal selected from the group consisting of La, Ce, Pr, Nd, Pm, Sm, Eu, Gd, Tb, Dy, Ho, Er, Tm, Yb, Lu, and Cr,
wherein the host material with the ions form a compound of a formula, the formula being one of $(A,B)_3X_5O_{12}$, $(A,B)_2X^*_3O_{12}$, $C_3(A,B)_2Z_3O_{12}$, $C_3(A,B)_2Z^*_6O_{24}$ and $(A,B)_3X_5N_8$,
wherein:
A=$Fe^{3+}$, $Cr^{3+}$, $V^{3+}$, $Ti^{3+}$, $Sc^{3+}$, $Lu^{3+}$ or $Y^{3+}$;
B is a trivalent cation of a metal selected from the group consisting of La, Ce, Pr, Nd, Pm, Sm, Eu, Gd, Tb, Dy, Ho, Er, Tm, Yb, Lu and Cr;
C=$Mg^{2+}$, $Fe^{2+}$, $Mn^{2+}$, $Pb^{2+}$ or $Ca^{2+}$;
X=$Al^{3+}$ or $B^{3+}$;
X*=$W^{6+}$;
Z=$Si^{4+}$ or $Ti^{4+}$; and
Z*=$W^{6+}$, and
wherein the conversion material configured to convert the primary radiation emitted by the semiconductor chip with a conversion over 95% into secondary radiation of a wavelength of between 1000 nm and 6000 nm.

* * * * *

UNITED STATES PATENT AND TRADEMARK OFFICE
CERTIFICATE OF CORRECTION

PATENT NO. : 9,859,473 B2  
APPLICATION NO. : 14/900155  
DATED : January 2, 2018  
INVENTOR(S) : Britta Goeoetz Page 1 of 1

It is certified that error appears in the above-identified patent and that said Letters Patent is hereby corrected as shown below:

In the Claims

In Column 9, Line 14, Claim 1, delete "woo nm" and insert --1000 nm--.

Signed and Sealed this
Nineteenth Day of June, 2018

Andrei Iancu
*Director of the United States Patent and Trademark Office*